United States Patent
Zhu et al.

(10) Patent No.: US 6,671,834 B1
(45) Date of Patent: Dec. 30, 2003

(54) MEMORY REDUNDANCY WITH PROGRAMMABLE NON-VOLATILE CONTROL

(75) Inventors: Theodore Zhu, Maple Grove, MN (US); Gary Kirchner, Maple Grove, MN (US); Richard W. Swanson, Zimmerman, MN (US); Yong Lu, Plymouth, MN (US)

(73) Assignee: Micron Technology, Inc., Boise, ID (US)

( * ) Notice: Subject to any disclaimer, the term of this patent is extended or adjusted under 35 U.S.C. 154(b) by 469 days.

(21) Appl. No.: 09/618,492

(22) Filed: Jul. 18, 2000

(51) Int. Cl.⁷ .............................. G11C 29/00
(52) U.S. Cl. .................. 714/711; 714/726; 714/727
(58) Field of Search ................... 714/711, 724, 714/30, 7, 726, 727; 365/185.05, 200, 185.09

(56) References Cited

U.S. PATENT DOCUMENTS

| | | | | |
|---|---|---|---|---|
| 4,837,520 A | | 6/1989 | Golke et al. ............... 324/550 |
| 5,406,565 A | * | 4/1995 | MacDonald ............... 714/711 |
| 5,644,529 A | * | 7/1997 | Pascucci et al. ........ 365/185.05 |
| 5,677,917 A | * | 10/1997 | Wheelus et al. ............. 714/724 |
| 5,680,354 A | * | 10/1997 | Kawagoe ................... 365/200 |
| 5,796,653 A | * | 8/1998 | Gaultier ................. 365/185.09 |
| 5,808,944 A | | 9/1998 | Yoshitake et al. .......... 365/200 |
| 6,317,846 B1 | * | 11/2001 | Higgins et al. ............... 714/30 |
| 6,397,349 B2 | * | 5/2002 | Higgins et al. ................. 714/7 |

* cited by examiner

Primary Examiner—David Ton
(74) Attorney, Agent, or Firm—Knobbe, Martens, Olson & Bear, LLP

(57) ABSTRACT

A redundancy scheme for a memory is disclosed that is programmable both before and after the memory device is packaged and/or installed in a system. This is preferably accomplished by using programmable non-volatile memory elements to control the replacement circuitry. Because the programmable memory elements are non-volatile, the desired replacement configuration is not lost during shipping, or if power is lost in a system. By allowing post-packaging replacement of defective memory elements, the overall yield of the device may be improved. By allowing post system installation replacement of defective memory elements, the reliability of many systems may be improved. In addition, the disclosed redundancy scheme allows two or more defective memory elements from different rows or columns to be replaced with memory elements from a single redundant low or column. This provides added flexibility during the replacement process.

32 Claims, 10 Drawing Sheets

MEMORY REDUNDANCY WITH PROGRAMMABLE NON-VOLATILE CONTROL

BACKGROUND OF THE INVENTION

The present invention relates to digital memories, and more particularly, to digital memories that are reconfigurable to replace selected defective memory elements with non-defective redundant memory elements for increased yield. In the context of the present invention, the term "digital memories" include static Random Access Memories (RAMs), dynamic RAMs, Magnetic RAMs, registers, latches and any other type of memory or memory device.

It is common in the manufacture of large-area integrated circuit devices for defects to occur. This is particularly true for high density circuits, such as digital memories. To increase the yield of such circuits, it is common to include redundant circuit elements that can be used to replace the defective circuit elements. For example, in many memory devices, redundant columns and/or redundant rows are provided. During wafer level testing, the defective memory elements are identified, and the defective columns or rows are replaced with redundant columns or rows for increased yield.

To perform such a replacement, replacement circuitry is typically provided. The replacement circuitry is often programmed using one or more fuses. Thus, depending on the desired replacement, selected fuses are conditioned (e.g., blown), which causes the replacement circuitry to affect the desired replacement. For digital memories, the fuses and replacement circuitry are typically configured so that an individual memory element cannot be replaced. Rather, an entire row or column must be replaced.

Common integrated circuit fuses include laser blown, laser annealed, or electrically blown type fuses. To condition the fuses, direct access to the fuses is often required. For example, to condition a laser blown or laser anneal type fuse, a laser must have access to the fuse. To condition an electrically blown type fuse, a high voltage or current probe must often have access to the fuse. Because access is often required, the fuses must typically be conditioned before the integrated circuit is packaged, as the fuses are no longer accessible after packaging.

For many integrated circuits, significant post-packaging tests and procedures are performed to evaluate the performance and reliability of the packaged part. For example, it is common to perform burn-in, shake and bake, and other tests on the packaged parts before they are shipped to customers. If one or more memory elements fail during the post-packaging tests or procedures, the part is often discarded, as there is typically no effective way to access the fuses to perform further repairs. Likewise, if some of the memory elements fail after installed in a system, the part must typically be removed and replaced. This can be particularly problematic for many high reliability applications such as space applications and banking applications, where the part cannot be easily replaced and/or the system cannot go down because of part failure at unscheduled times.

SUMMARY OF THE INVENTION

The present invention overcomes many of the disadvantages of the prior art by providing a redundancy scheme for a memory that is programmable both before and after the device is packaged and/or installed in a system. This is preferably accomplished by using programmable non-volatile memory elements to control the replacement circuitry. Because the programmable memory elements are non-volatile, the desired replacement configuration is not lost during shipping, or if power is lost in a system. By allowing post-packaging replacement of defective memory elements, the overall yield of the device may be improved. By allowing post system installation replacement of defective memory elements, the reliability of many systems may be improved.

The present invention also contemplates a redundancy scheme that allows two or more defective memory elements from different rows or columns to be replaced with memory elements from a single redundant row or single redundant column. This provides added flexibility during the replacement process, and may increase the number of defective memory elements that can be replaced with a limited number of redundant rows and/or redundant columns.

In a first illustrative embodiment of the present invention, a memory is provided that includes one or more memory elements and one or more redundant memory elements. A programmable replacement circuit is provided for replacing a selected memory element with a selected redundant memory element. The programmable replacing circuit preferably includes a non-volatile memory and is controlled, at least in part, by the value stored in the non-volatile memory. The programmable replacing circuit may use the value stored in the non-volatile memory to determine which of the redundant memory elements should be used to replace the selected memory element. Alternatively, or in addition, the programmable replacing circuit may use the value stored in the non-volatile memory element to determine which of the memory elements is selected for replacement by the selected redundant memory element.

For many digital memories, the memory elements are arranged in a number of rows and a number of columns. Each of the rows is addressed by a row address, and each of the number of columns is addressed by a column address. Typically, one or more redundant rows or redundant columns are provided, or both. When a number of redundant columns are provided, and in an illustrative embodiment, a multiplexer or the like may be provided for each column in the array. The multiplexer preferably selects between the output of the corresponding column in the array and the outputs of the one or more redundant columns.

The non-volatile memory may then control the selection of each multiplexer. For example, when a defective memory element is found in a first column of the array, the non-volatile memory may cause the first multiplexer to select the output of a first redundant column. Likewise, when a defective memory element is found in a second column of the array, the non-volatile memory may cause the second multiplexer to select the output of a second redundant column. In some cases, if the defective memory element in the first column is not in the same row as the defective memory element in the second column, the non-volatile memory may cause the first multiplexer and the second multiplexer to select the output of the same redundant column.

The selection of which redundant column to select may be controlled by a number of non-volatile memory elements, one for each multiplexer. The non-volatile memory elements may be directly coupled to the selection inputs of the multiplexers. Alternatively, the selection may be controlled by a programmable controller. For maximum flexibility, the controller may determine which redundant column to select based on the row address currently provided to the memory, and the location (e.g., row) of other defective bits. This flexibility may increase the number of defective memory elements that can be replaced with a limited number of redundant columns.

When a number of redundant rows are provided, it is contemplated that a number of non-volatile memory elements or a programmable controller with non-volatile memory may be provided. The non-volatile memory elements may be programmed to directly disable a defective row and enable a redundant row. When a programmable controller is provided, the programmable controller preferably controls which word line is activated during each memory access. In a typical memory, each row (including each redundant row) is controlled by a unique word line. Preferably, the programmable controller can identify which rows have at least one defective memory element. When one of these rows are accessed, the programmable controller activates a word line of one of the redundant rows to affect the desired replacement.

The programmable controller may include a lookup table using, at least in part, non-volatile memory elements. The programmable controller provides the row address to the lookup table. The value provided by the lookup table preferably controls the replacement circuitry. In one embodiment, if the row identified by the row address has a defective memory element, the value provided by the lookup table disables the word line of that row, and enables the word line of a selected redundant row. Likewise, if the row identified by the row address does not have a defective memory element, the value provided by the lookup table enables the word line of the row addressed by the row address, and does not enable the word line of any of the redundant rows.

Alternatively, or in addition to, the programmable controller may include non-volatile registers for storing the row addresses that have at least one defective memory element. A comparator or the like may then compare the row address that is provided to the memory with the row addresses stored in the non-volatile registers. If the current row address matches a row address stored in the non-volatile registers, the word line that corresponds to the current row address is disabled, and the word line of a selected redundant row is enabled. It is contemplated that the non-volatile registers may store an identifier for identifying which redundant row should be activated when the current row address matches a row address stored in the non-volatile registers.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DETAILED DESCRIPTION OF THE PREFERRED EMBODIMENTS

Figure 1:
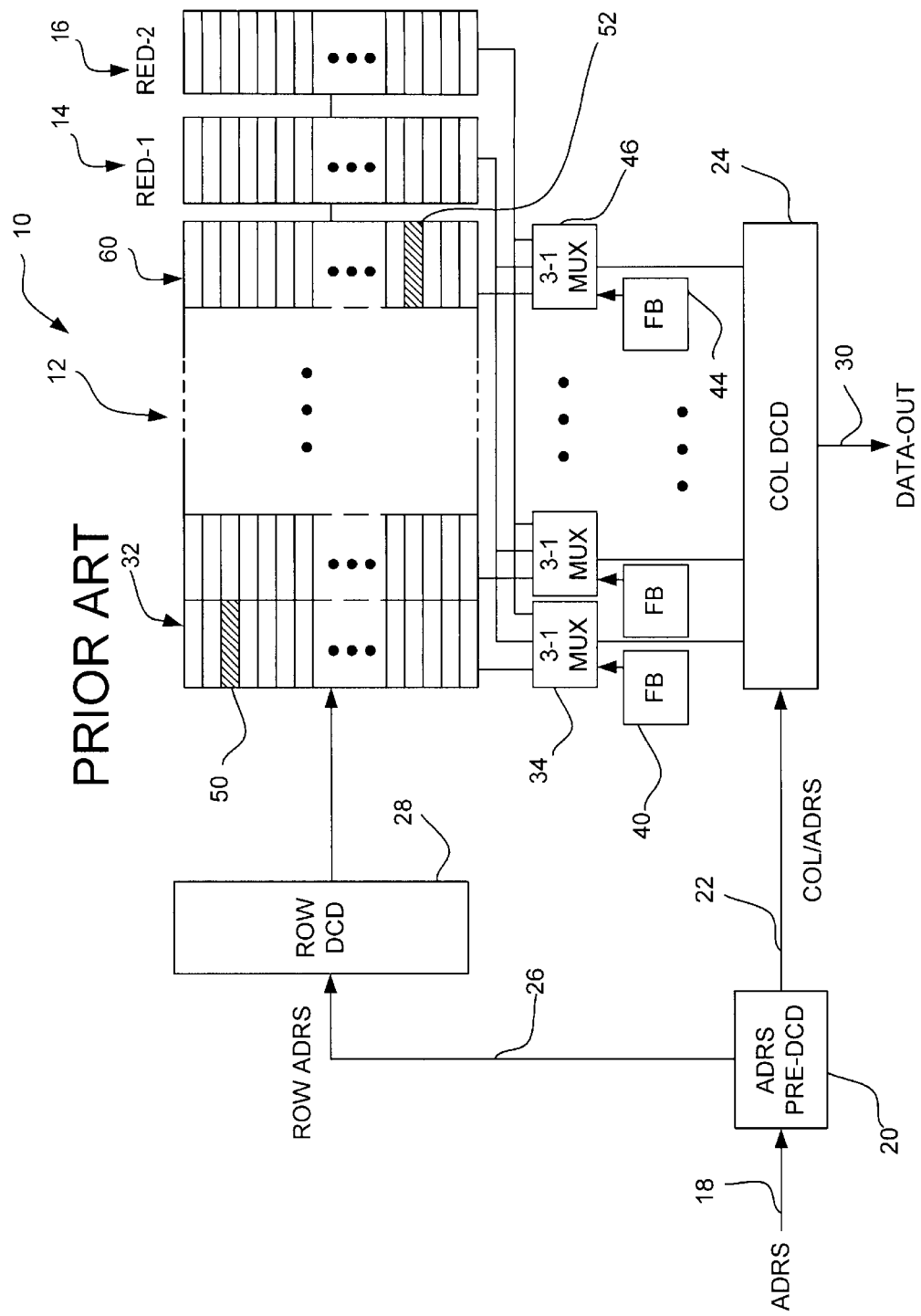
FIG. 1 is a schematic diagram of a typical prior art memory with two redundant columns.

FIG. 1 is a schematic diagram of a typical prior art memory with two redundant columns. The memory is generally shown at 10, and includes a memory array 12 having a number of rows and a number of columns. An address 18 is provided to Address Predecode Block 20, which provides a column address 22 to Column Decoder 24, and a row address 26 to Row Decoder 28. The Row Decoder 28 accepts the row address 26 and activates a corresponding word line, which selects a desired row of memory elements. The Column Decoder 24 accepts the column address 22 and allows data from selected columns to pass to the data output terminal 30.

To provide redundancy, a first redundant column 14 and a second redundant column 16 are provided. A multiplexer is also inserted between each column and the Column Decoder 24. Each multiplexer is controlled by a corresponding fuse bank. By selectively conditioning the fuse banks, the multiplexers can select either the output of the corresponding column, the output of the first redundant column 14, or the output of the second redundant column 16.

During wafer testing, all of the defective memory elements are identified. In the diagram shown, memory elements 50 and 52 are shown to be defective. Defective memory element 50 is in the first column 32, and defective memory element 52 is in the last column 60. To replace the defective memory elements 50 and 52, the first column 32 is replaced with the first redundant column 14, and the last column 60 is replaced with the second redundant column 16. To affect this replacement, fuse bank 40 is conditioned such that the first multiplexer 34 selects the output of the first redundant column 14, and fuse bank 44 is conditioned such that the last multiplexer 46 selects the output of the second redundant column 16.

When configured in this manner, data from the first redundant column 14 is passed through multiplexer 34 to Column Decoder 24, and data from the second redundant column 16 is passes through multiplexer 46 to Column Decoder 24. Data provided by the first column 32 and the last column 60 of the memory array 12 are no longer selected. Note that an entire column in the memory array must be replaced with an entire redundant column.

Figure 2:
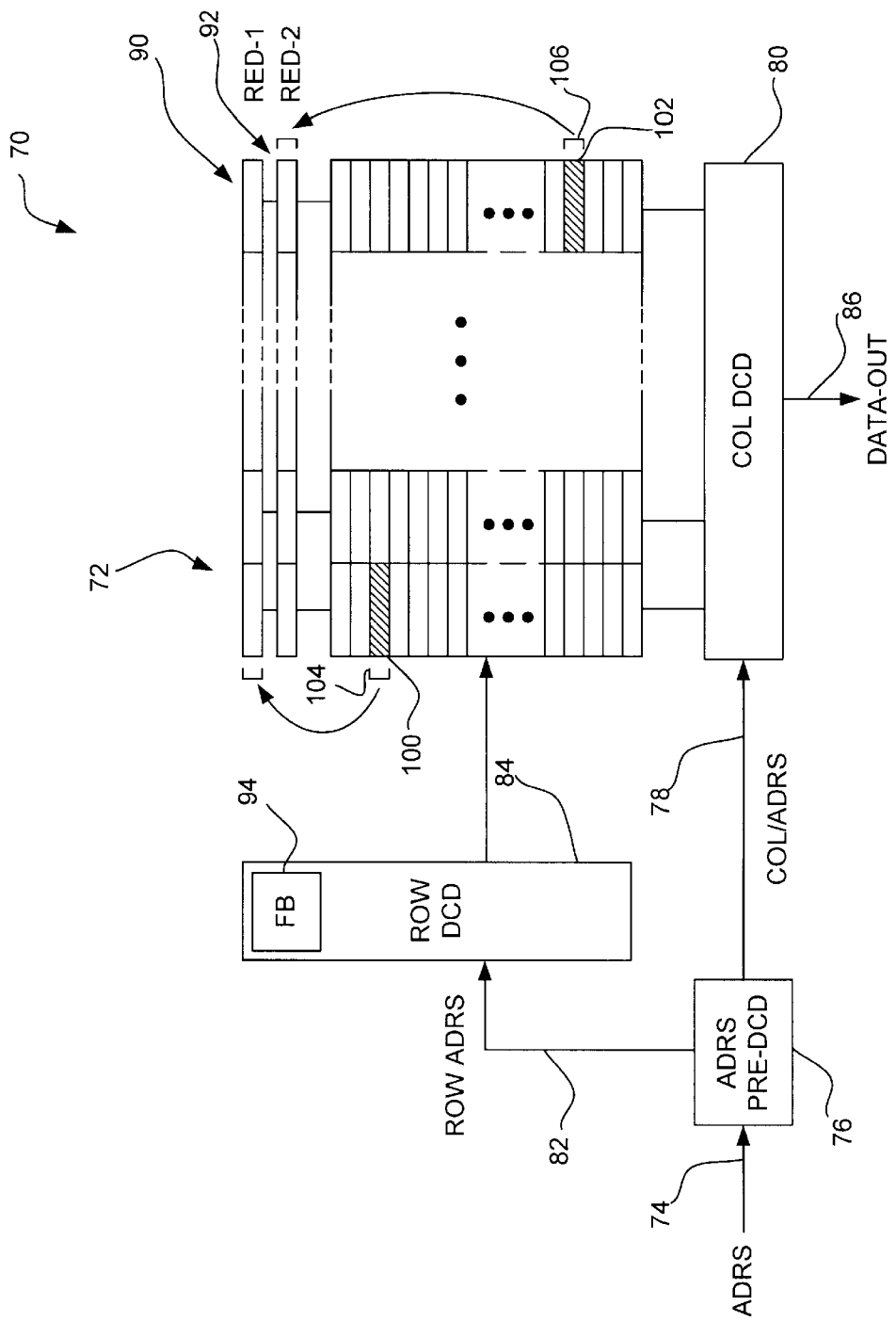
FIG. 2 is a schematic diagram of a typical prior art memory with two redundant rows.

FIG. 2 is a schematic diagram of a typical prior art memory with two redundant rows. The memory is generally shown at 70, and includes a memory array 72 having a number of rows and a number of columns. An address 74 is provided to Address Pre-decode Block 76, which provides a column address 78 to Column Decoder 80, and a row address 82 to Row Decoder 84. Like above, the Row Decoder 84 accepts the row address 82 and activates a corresponding word line, which selects a desired row of memory elements. The Column Decoder 80 accepts the column address 78, and allows data from selected columns to pass to the data output terminal 86.

To provide redundancy, a first redundant row 90 and a second redundant row 92 are provided. The Row Decoder 84 includes a fuse bank 94 and replacement circuitry. By selectively conditioning the fuse bank 94, the Row Decoder can deselect a word line that corresponds to the row address, and instead, activate the word line of one of the first or second redundant rows 90 and 92.

During wafer testing, all of the defective memory elements are identified. In the diagram shown, memory elements 100 and 102 are shown to be defective. Defective memory element 100 is in an Nth row 104, and defective memory element 102 is in an Mth row 106. In the illustrative diagram, the Nth row corresponds to the "2nd" row of the memory array. To replace the defective memory elements 100 and 102, the Nth row 104 is replaced with the first redundant row 90, and the Mth row 106 is replaced with the second redundant row 92.

Figure 3:
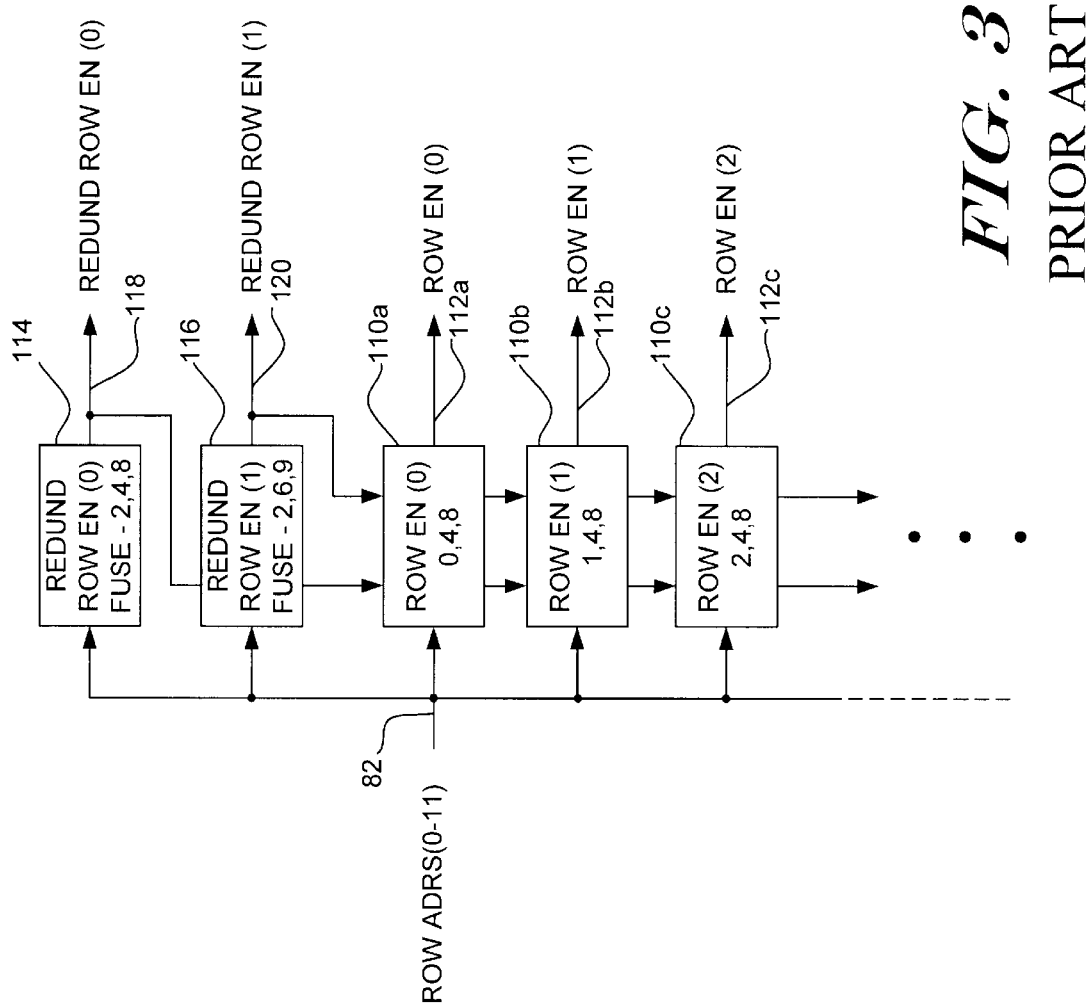
FIG. 3 is a schematic diagram of a typical Row Decode block of FIG. 2.

FIG. 3 is a schematic diagram of Row Decode block 84 of FIG. 2. The row address 82 is provided to a series of Row Enable Blocks 110a, 110b, and 110c. Each of the Row Enable Blocks 110a, 110b and 110c provide a row enable signal to one of the rows of the memory array 72. For example, Row Enable Block 110a provides a row enable signal 112a to the "0$^{th}$" row, Row Enable Block 110b provides a row enable signal 112b to the "1$^{st}$" row, and Row Enable, Block 110c provides a row enable signal 112b to the "2$^{nd}$" row 104. The row enable signals 112a, 112b and 112c are coupled to the word lines of the corresponding rows.

In the diagram shown, the row address 82 is a pre-decoded address that includes twelve bits. The row address 82 is then broken into three fields, each having four bits. The row enable signal 112a is activated when the "0" bit of the first field is high, the "4" bit of the second field is high, and the "8" bit of the last field is high. The next row enable signal 112b is activated when the "1,4,8" bits are high. The row enable signal 112c is activated when the "2,4,8" bit are high. The remaining row enable signals are addressed in a similar manner.

The first redundant row 90 is controlled by a first Redundant Row Enable block 114, and the second redundant row 92 is controlled by a second Redundant Row Enable block 116. The first Redundant Row Enable block 114 includes a fuse bank and control logic, and the second Redundant Row Enable block 116 includes a fuse bank and control logic. The fuse bank of the first Redundant Row Enable block 114 is conditioned such that the first redundant row enable signal 118 is enabled when the "2,4,8" bits are high. Thus, the first redundant row 90 replaces the "2" row 104. As shown in FIG. 2, the "2" row 104 includes defective memory element 100.

The first redundant row enable signal 118 is provided to each of the Row Enable blocks 110a, 110b and 110c, as shown. When the first redundant row enable signal 118 is enabled, all of the Row Enable blocks 110a, 110b and 110c become disabled. Thus, Row Enable block 110c does not enable the "2$^{nd}$" row 104 when the first Redundant Row Enable block 114 is enabled.

The fuse bank of the second Redundant Row Enable block 116 is conditioned such that the second redundant row enable signal 120 is enabled when the "2,6,9" bits are high. For illustrative purposes, the row address "2,6,9" corresponds to the Mth row of the memory array. Thus, the second redundant row 92 replaces the Mth row 106. As shown in FIG. 2, the Mth row 106 includes defective memory element 102.

The second redundant row enable signal 120 is provided to each of the Row Enable blocks 110a, 110b and 110c, as shown. When the second redundant row enable signal 120 is enabled, all of the Row Enable blocks 110a, 110b and 110c become disabled. Thus, the Row Enable block that corresponds to the Mth row does not enable the Mth row 106 when the second Redundant Row Enable block 116 is enabled.

Figure 4:
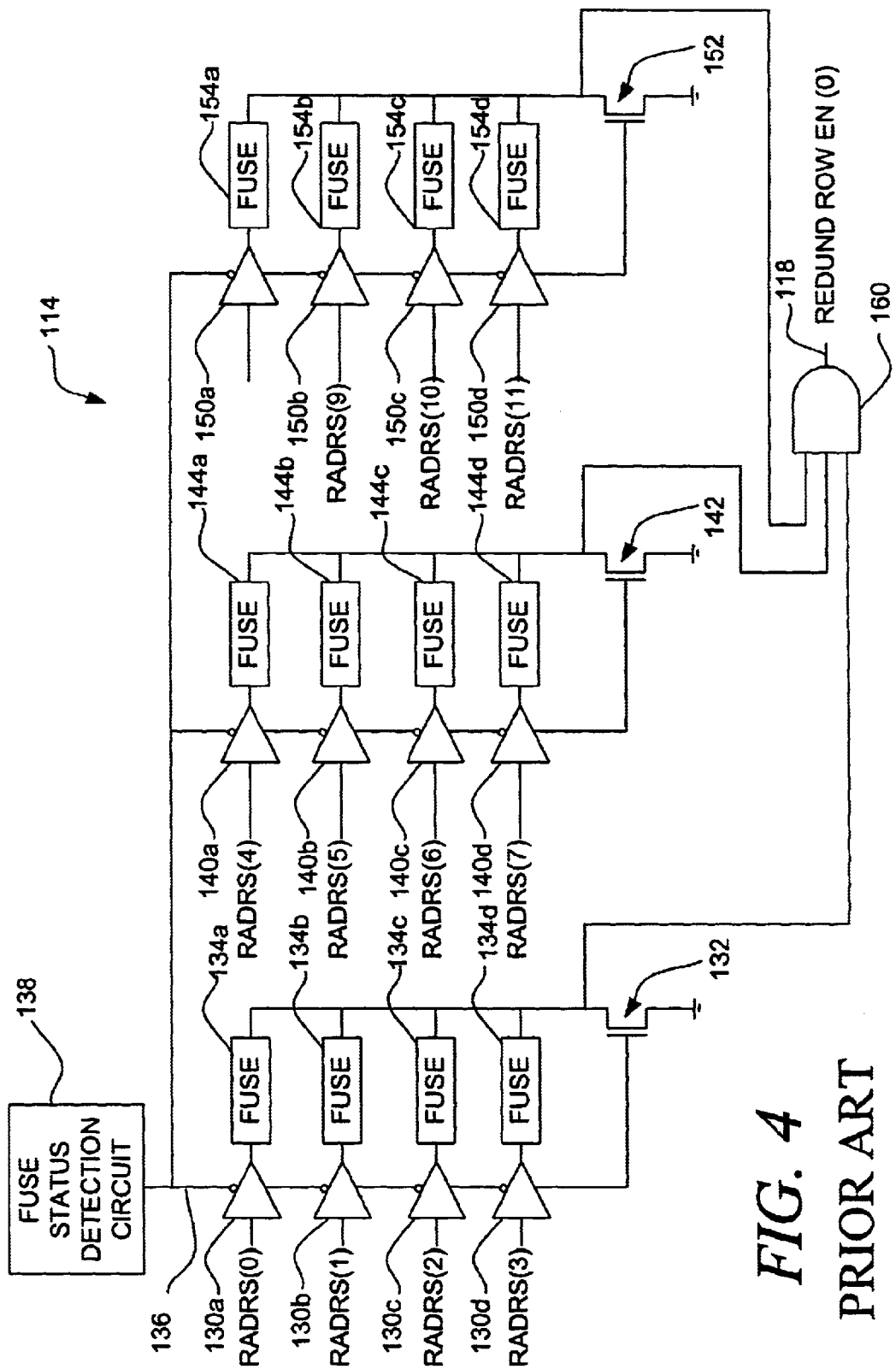
FIG. 4 is a schematic diagram of a typical Redundant Row Enable block of FIG. 3.

FIG. 4 is a schematic diagram of one of the Redundant Row Enable blocks of FIG. 3. Bits 0–4 of the row address 82 are provided to the tri-state buffers 130a, 130b, 130c and 130d, respectively. The outputs of tri-state buffers 130a, 130b, 130c and 130d are coupled to the drain of an n-channel transistor 132 through fuses 134a, 134b, 134c and 134d. An enable signal 136 is provided to each of tri-state buffers 130a, 130b, 130cand 130d and to the gate of n-channel transistor 132 by a fuse status detection circuit 138. The Fuse Status Detection Circuit 138 may be similar to that described in U.S. Pat. No. 4,837,520 to Golke et al. When selected fuses of Fuse Status Detection Circuit 138 are conditioned, the enable signal is activated.

Bits 4–7 of the row address 82 are provided to tri-state buffers 140a, 140b, 140c and 140d, respectively. The outputs of tri-state buffers 140a, 140b, 140c and 140d are coupled to the drain of n-channel transistor 142 through fuses 144a, 144b, 144c and 144d. The enable signal 136 is provided to each of tri-state buffers 140a, 140b, 140c and 140d, and to the gate of n-channel transistor 142.

Finally, bits 8–11 of the row address 82 are provided to tri-state buffers 150a, 150b, 150c and 150d, respectively. The outputs of tri-state buffers 150a, 150b, 150c and 150d are coupled to the drain of n-channel transistor 152 through fuses 154a, 154b, 154cand 154d. The enable signal 136 is provided to each of tri-state buffers 150a, 150b, 150c and 150d, and to the gate of n-channel transistor 152.

The drain terminals of n-channel transistors 132, 142 and 152 are provided to an AND gate 160. The AND gate 160 the provides the redundant row enable signal 118 to the first redundant row 90. To replace the "2" row 104 of the memory array 72 of FIG. 2 with the first redundant row 90, fuses 134a, 134b, 134d, 140b, 140c, 140d, 154b, 154c and 154d are blown. Then, the fuses in the Fuse Status Detection Circuit 138 are conditioned to activate the enable signal 136. This allows bits "2,4,8" of the row address 82 to pass to the inputs of AND gate 160. When each of the bits are high, the redundant row enable signal 118 for the first redundant row 90 is activated.

Figure 5:
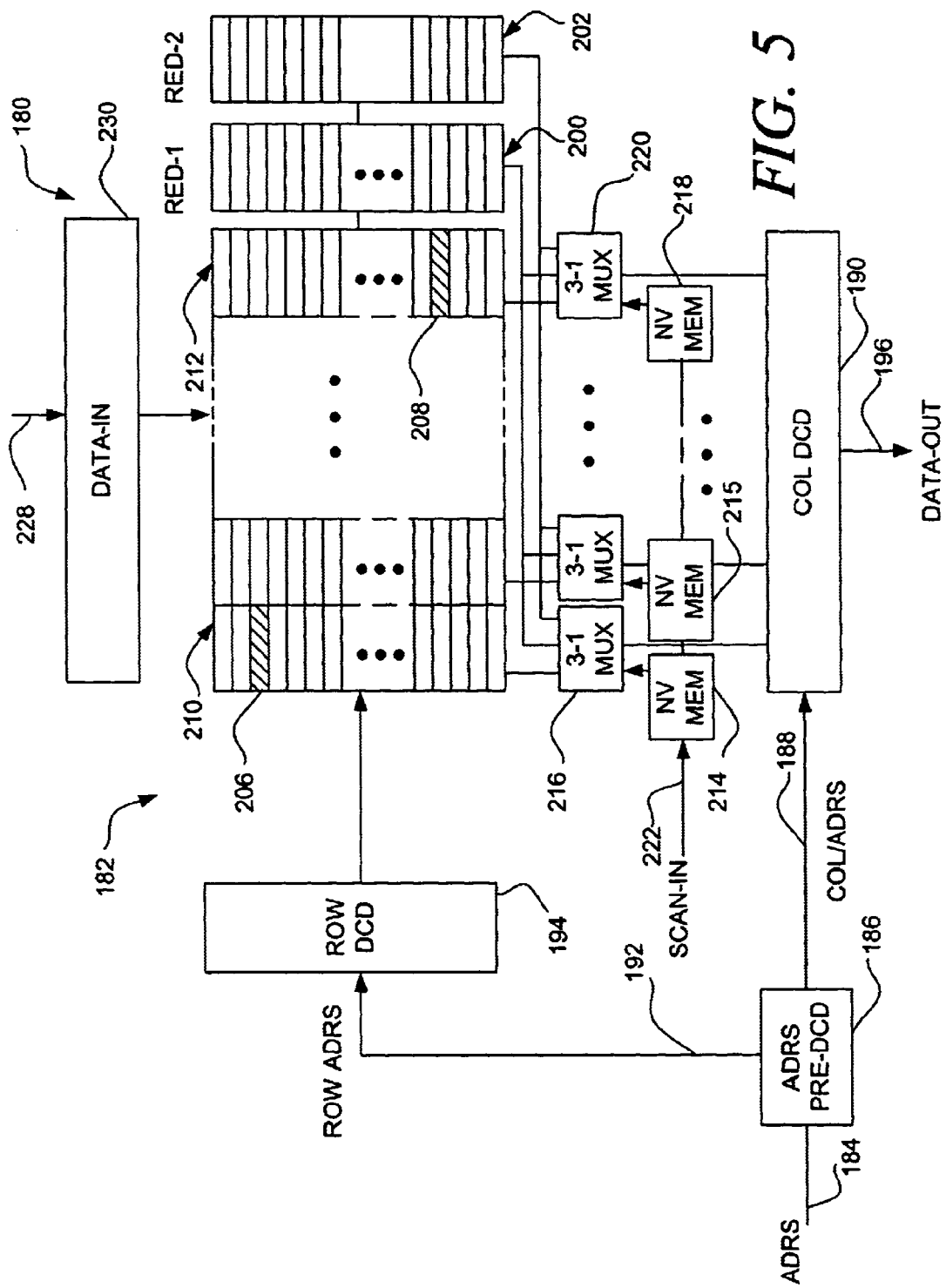
FIG. 5 is a schematic diagram of a first illustrative embodiment of the present invention including a number of non-volatile memory elements for redundant column control.

FIG. 5 is a schematic diagram of a first illustrative embodiment of the present invention including a number of non-volatile memory elements for redundant column control. The memory architecture is similar that that described above with reference to FIG. 1, but uses non-volatile memory elements instead of fuse banks.

The memory is generally shown at 180, and includes a memory array 182 having a number of rows and a number of columns. An address 184 is provided to Address Pre-decode Block 186, which provides a column address 188 to Column Decoder 190, and a row address 192 to Row Decoder 194. The Row Decoder 194 accepts the row address 192 and activates a corresponding word line, which selects a desired row of memory elements. The Column Decoder 190 accepts the column address 188, and allows data from selected columns to pass to the data output terminal 196.

To provide redundancy, a number of redundant columns may be provided. In the illustrative embodiment, a first redundant column 200 and a second redundant column 202 are provided. A multiplexer is inserted between each column and the Column Decoder 190. Each multiplexer is controlled by one or more non-volatile memory elements. By storing appropriate information in the non-volatile memory elements, the multiplexers can select either the output of the corresponding column, the output of the first redundant column 200, or the output of the second redundant column 202.

During wafer testing, all of the defective memory elements are identified. In the diagram shown, memory elements 206 and 208 are shown to be defective. Defective memory element 206 is in the first column 210, and defective memory element 208 is in the last column 212. To replace the defective memory elements 206 and 208, the first column 210 is replaced with the first redundant column 200, and the last column 212 is replaced with the second redundant column 202. To affect this replacement, non-volatile memory element 214 is loaded with a value that causes the first multiplexer 216 to select the output of the first redundant column 200, and non-volatile memory element 218 is loaded with a value that causes the last multiplexer 220 to select the output of the second redundant column 202.

When configured in this manner, data from the first redundant column 200 is passed through multiplexer 216 to Column Decoder 190, and data from the second redundant column 202 is passed through multiplexer 220 to Column Decoder 190. Data provided by the first column 210 and the last column 212 of the memory array 182 are no longer selected.

Preferably, the non-volatile memory elements are connected together in a scan chain, as shown. A scan-in terminal 222 may be provided and connects to one or more pins on the package. Prior to wafer level testing, all of the non-volatile memory elements 214, 215 and 216 are preferably loaded with a value that causes the corresponding multiplexer to select the output of the corresponding column of the memory array 182. Once loaded, the memory is tested, and all defective bits are identified in a conventional manner. Thereafter, a new value may be scanned into the non-volatile memory elements to affect the replacement of those columns that have a defective memory element therein.

An advantage of this embodiment over that shown in FIG. 1 is that the redundancy scheme can be programmable both before and after the device has been packaged and/or installed in a system. That is, if additional defective bits are discovered during post-packing tests and procedures, a new value may be scanned into the non-volatile memory elements to affect the replacement of additional columns that have a defective memory element therein. By allowing post-packaging replacement of defective memory elements, the overall yield of the device may be improved.

If additional defective bits are discovered after the part is installed in a system, such as via a self-test routine, another value may be scanned into the non-volatile memory elements to affect the replacement of additional columns that have a defective memory element therein. By allowing post system installation replacement of defective memory elements, the reliability of many systems may be improved.

Finally, it is contemplated that additional non-volatile memory elements may be. provided to direct the input data 228 to the appropriate columns, including the redundant columns, during a write operation. These non-volatile memory elements are preferably provided in Data-In Block 230.

Figure 6:
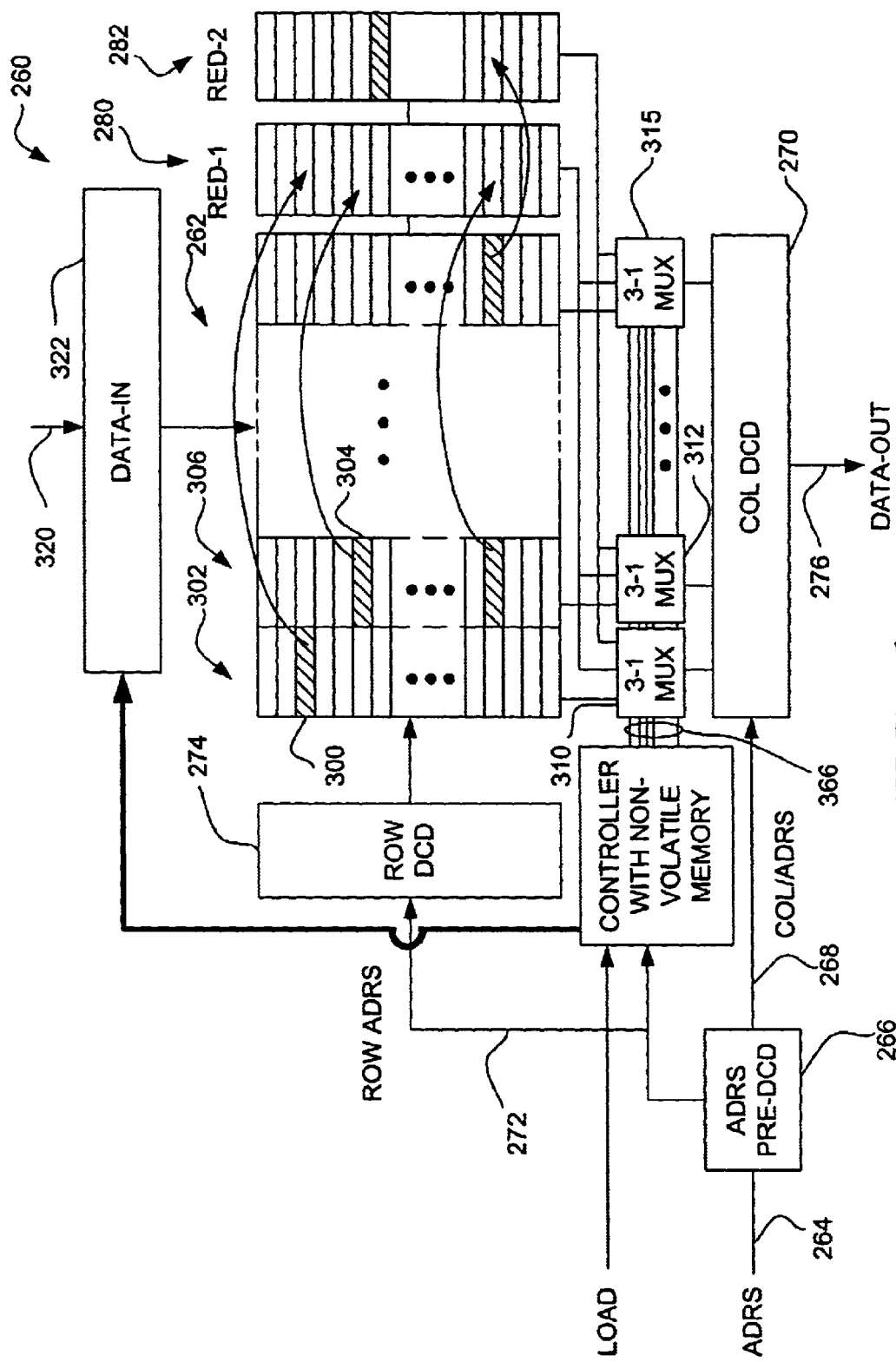
FIG. 6 is a schematic diagram of another illustrative embodiment of the present invention including a programmable controller for redundant column control.

FIG. 6 is a schematic diagram of another illustrative embodiment of the present invention. The illustrative memory architecture is similar that that described above with reference to FIG. 5, but uses a programmable controller for redundant column control. The memory is generally shown at 260, and includes a memory array 262 having a number of rows and a number of columns. An address 264 is provided to Address Pre-decode Block 266, which provides a column address 268 to Column Decoder 270, and a row address 272 to Row Decoder 274. The Row Decoder 274 accepts the row address 272 and activates a corresponding word line, which selects a desired row of memory elements. The Column Decoder 270 accepts the column address 268, and allows data from selected columns to pass to the data output terminal 276.

To provide redundancy, a number of redundant columns may be provided. In the illustrative embodiment, a first redundant column 280 and a second redundant column 282 are provided. A multiplexer is inserted between each column and the Column Decoder 270. Each multiplexer is controlled by the Programmable Controller 284. By providing appropriate control signals, the multiplexers can select either the output of the corresponding column, the output of the first redundant column 280, or the output of the second redundant column 282. The Programmable Controller 284 is preferably programmed by loading values into a number of non-volatile memory elements. Two illustrative embodiments of the Programmable Controller 284 are described below with reference to FIGS. 7–8.

The Programmable Controller 284 preferably receives the row address 272 from the address decoder 266, as shown. Depending on the particular row address that is currently accessed, the Programmable Controller 284 may cause different column replacements. This allows the Programmable Controller 284 to replace two or more defective memory elements from different rows or columns with memory elements from a single redundant row or redundant column.

To illustrate this further, a first defective memory element 300, which is in the first column 302, and a second defective memory element 304, which is in the second column 306, are both replaced with memory elements from the first redundant column 280. The Programmable Controller 284 causes the multiplexer 310 to select the output of the first redundant column 280, and causes the multiplexer 312 to select the output of the second column 306, when the row address 272 corresponds to the row that includes the first defective memory element 300.

The Programmable Controller 284 then causes the multiplexer 310 to select the output of the first column 302, and causes multiplexer 312 to select the output of the first redundant column 280, when the row address 272 corresponds to the row that includes the second defective memory element 304. Accordingly, several defective memory elements from more than one column can be replaced or mapped to the same redundant column. This may provide added flexibility, and may increase the number of defective memory elements that can be replaced with a limited number of redundant rows and/or redundant columns.

It is contemplated that the Programmable Controller 284 may also control Data-in Block 322 such that the input data 320 is provided to the appropriate columns, including the redundant columns, during a write operation. The direction of the input data 320 may depend on the particular row address 272 accessed, similar to that described above.

Preferably, the non-volatile memory elements in the Programmable Controller 284 can be loaded from one or more external pins. This allows the Programmable Controller 284 to be programmed before and after the device has been packaged and/or installed in a system. Thus, if additional defective bits are discovered during post-packing tests and procedures, a new value may be scanned into the non-volatile memory elements to affect the replacement of the newly discovered defective memory elements. By allowing post-packaging replacement of defective memory elements, the overall yield of the device may be improved.

If additional defective bits are discovered after the part is installed in a system, such as via a self-test routine, another value may be scanned into the non-volatile memory elements to affect the replacement of the defective memory elements. By allowing post system installation replacement of defective memory elements, the reliability of many systems may be improved.

Figure 7:
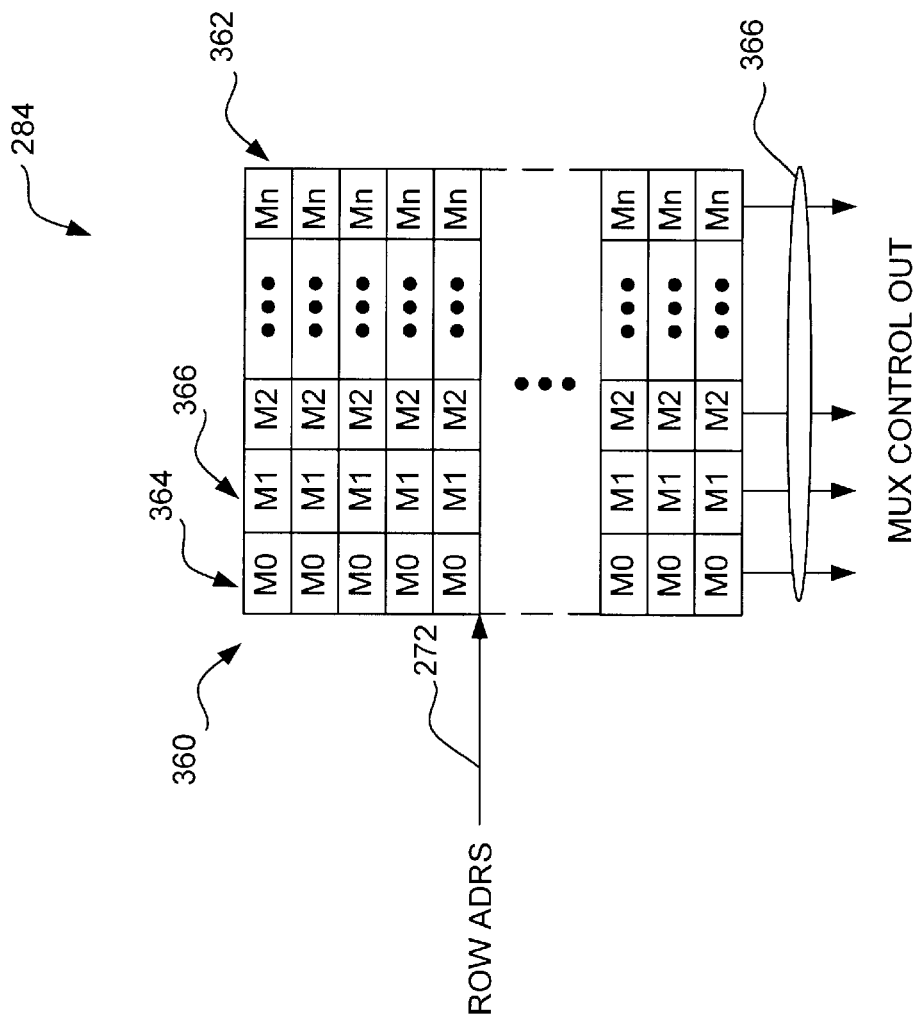
FIG. 7 is a schematic diagram of an illustrative embodiment of the programmable controller of FIG. 6.

FIG. 7 is a schematic diagram of an illustrative embodiment of the programmable controller 284 of FIG. 6. The programmable controller 284 includes a look-up table 360 that has a number of non-volatile memory elements. The non-volatile memory elements are arranged into a number of words, such as word 362. Each word stores control signals for each multiplexer of FIG. 6, including multiplexers 310, 312, and 315. For example, the control signals for the first multiplexer 310 are stored in the first column 364, the control signals for the second multiplexer 312 are stored in the second column, and so on.

During use, the row address 272 is provided to the look-up table 360, which selects one of the words in the look-up table. The control signals stored in the selected word are then provided to the multiplexers via mux control lines 366. As can readily be seen, the Programmable Controller 284 can provide unique control signals to each multiplexer of FIG. 6 for each row address. This provides maximum flexibility in replacing defective memory elements, and may increase the number of defective memory elements that can be replaced with a limited number of redundant rows and/or redundant columns.

Figure 8:
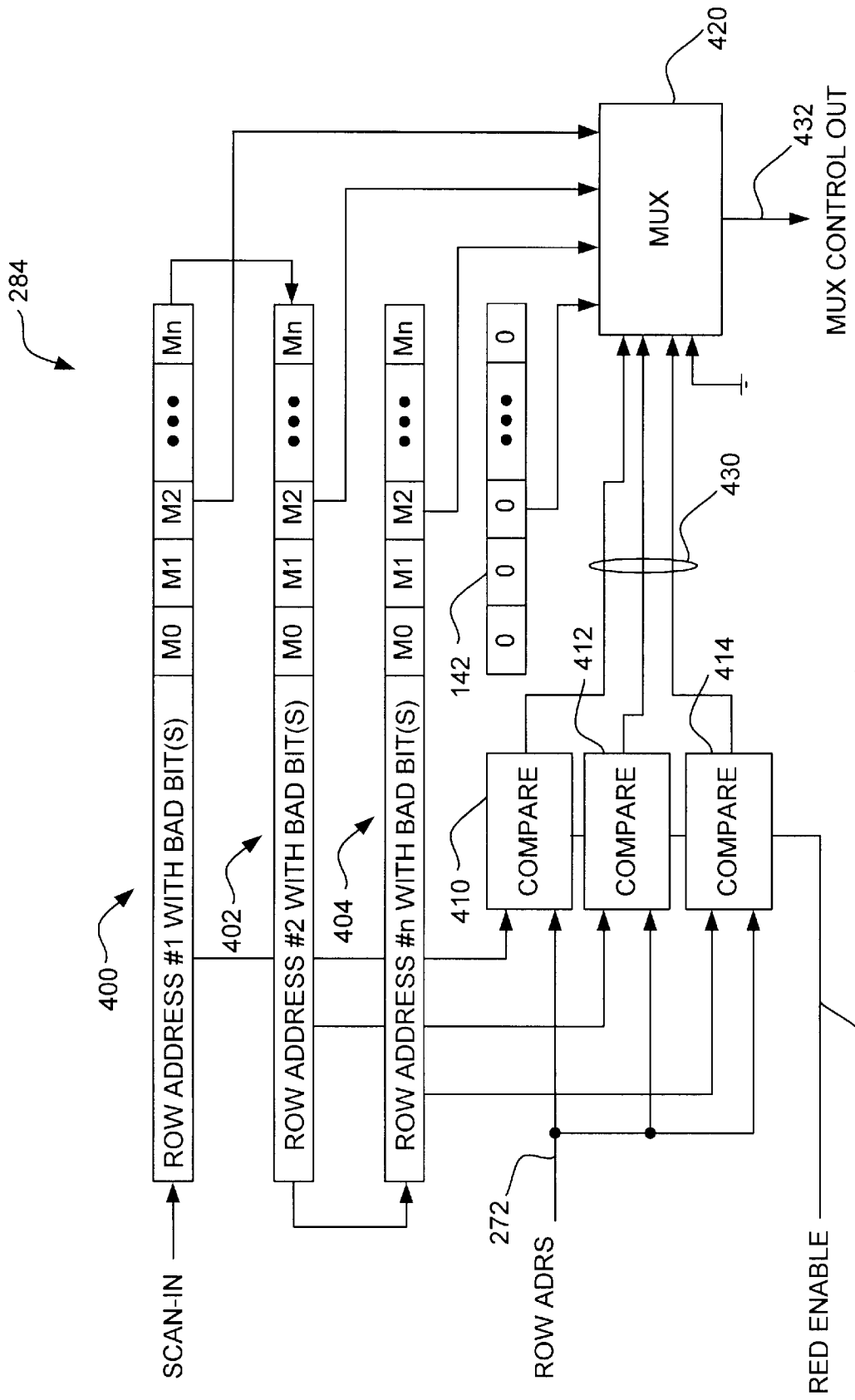
FIG. 8 is a schematic diagram of another illustrative embodiment of the programmable controller of FIG. 6.

FIG. 8 is a schematic diagram of another illustrative embodiment of the programmable controller of FIG. 6. Rather than storing control signals for each row address, this embodiment only stores those row addresses that have a defective memory element. For example, the row address of a first row having a defective memory element may be stored in non-volatile register 400. Likewise, the row address of another row having a defective memory element may be stored in non-volatile register 402. Finally, the row address of an Nth row having a defective memory element may be stored in non-volatile memory 404.

Each non-volatile register 400, 402 and 404 may also store control signals for each multiplexer of FIG. 6, including multiplexers 310, 312 and 315. These control signals are provided to a multiplexer 420, as shown. A default set of control signals, which cause each multiplexer to select the corresponding column of the memory array is 262, is also provided to the multiplexer 420.

In use, the row address is compared to each of the row addresses stored in the non-volatile registers 400, 402 and 404 using comparators 410, 412 and 414, respectively. If the row address does not match any of the row addresses stored in the non-volatile registers 400, 402 and 404, the select lines 430 provided to multiplexer 420 are all zero, allowing the default control signals 422 to pass to the mux control output 432. This would occur when the row address corresponds to a row with no defective memory elements. If, however, the row address matches one of the row addresses stored in the non-volatile registers 400, 402 and 404, the corresponding comparator asserts one of the select lines 430, which causes the control signals stored in the corresponding non-volatile register to pass to the mux control output 432.

During initial wafer level testing, the redundant enable signal 442 is preferably held low, thereby disabling the comparators 410, 412 and 414. This causes the multiplexer 420 to pass the default control signals 422 to the mux control output 432. Accordingly, none of the rows in the memory array will be replaced with one of the redundant columns 280 or 282. This may allow the memory elements in the array to be effectively tested. Alternatively, it is contemplated that a row address that is out of range may be loaded into the non-volatile registers 400, 402 and 404. Thus, the row address 272 will never match the row addresses in the non-volatile registers 400, 402 and 404, allowing the memory elements in the array to be effectively tested.

It is contemplated that the non-volatile registers 400, 402 and 404 may be connected in a scan chain configuration. Thus, new row addresses and/or control signals may be loaded into the non-volatile registers 400, 402 and 404 at any time, including after packing and system installation. This embodiment provides the same flexibility as that shown and described with reference to FIG. 7, but may require less hardware.

Figure 9:
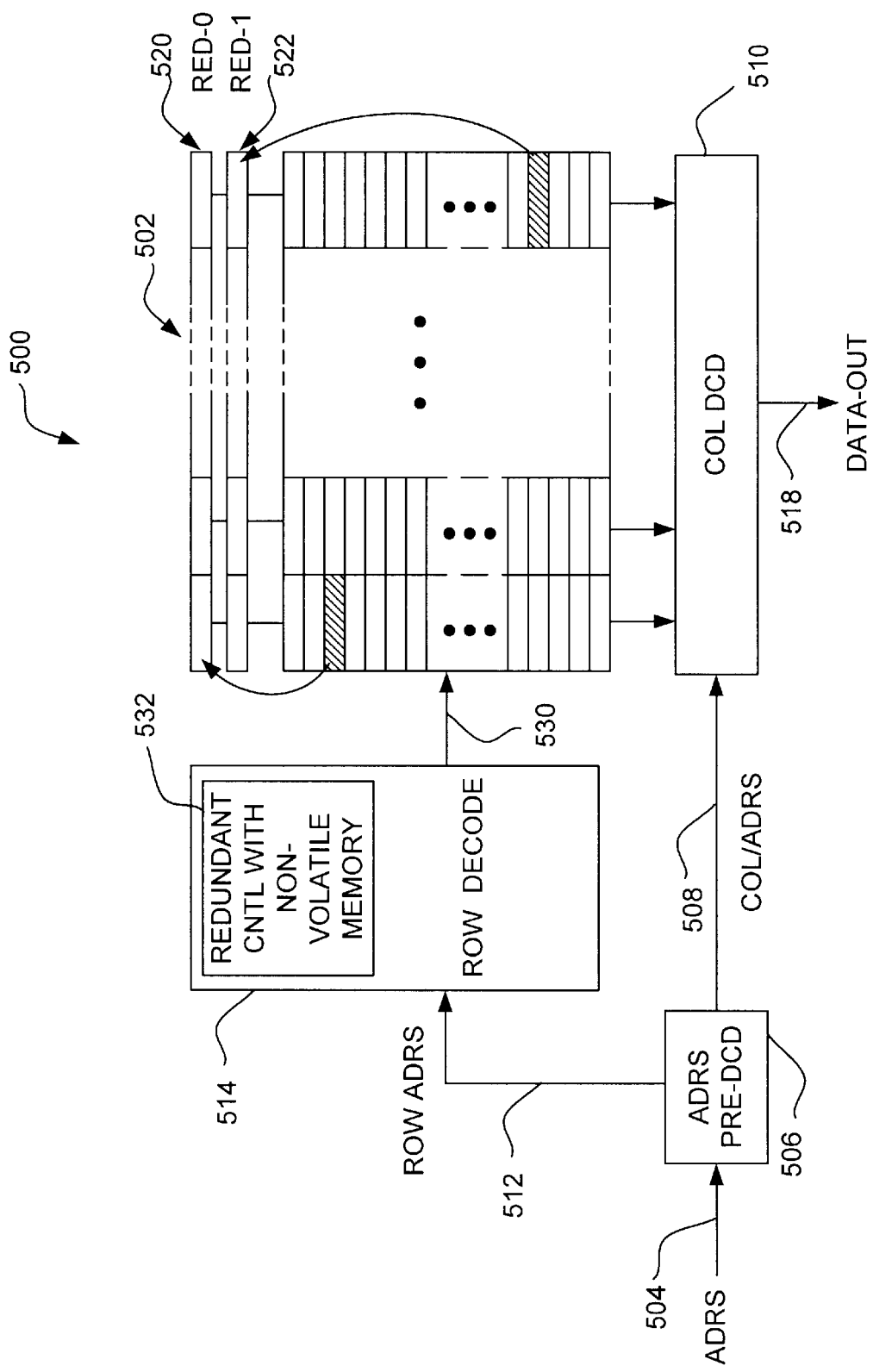
FIG. 9 is a schematic diagram of yet another illustrative embodiment of the present invention including a programmable controller for redundant row control.

FIG. 9 is a schematic diagram of yet another illustrative embodiment of the present invention including a programmable controller for redundant row control. The memory is generally shown at 500, and includes a memory array 502 having a number of rows and a number of columns. An address 504 is provided to Address Pre-decode Block 506, which provides a column address 508 to Column Decoder 510, and a row address 512 to Row Decoder 514. The Row Decoder 514 accepts the row address 512 and activates a corresponding word line, which selects a desired row of memory elements. The Column Decoder 510 accepts the column address 508, and allows data from selected columns to pass to the data output terminal 518.

To provide redundancy, a number of redundant rows may be provided. In the illustrative embodiment, a first redundant row 520 and a second redundant column 522 are provided. Each row, including each redundant row 520 and 522, is controlled by a unique word line. The word lines for all rows are collectively shown at 530. The Row Decode Block 514 selects the word line that corresponds to the row address 512.

The Row Decode Block 514 preferably includes a programmable controller with non-volatile memory 532. In the illustrative embodiment, the Programmable Controller 532 controls which word line is activated during each memory access. Preferably, the Programmable Controller 532 identifies the rows that have at least one defective memory element. When one of these rows are accessed, the Programmable Controller activates a word line of one of the redundant rows 520 or 522 to affect the desired replacement.

In one embodiment, the Programmable Controller 532 may include a lookup table formed using non-volatile memory elements as described above. The Programmable Controller 532 may provide the row address 512 to the lookup table. The value provided by the lookup table may then control replacement circuitry. More specifically, if the row address has a defective memory element, the value provided by the lookup table may disable the word line of the defective row, and enable the word line of one of the redundant rows 520 and 522. If, however, the row address does not have a defective memory element, the value provided by the lookup table may enable the word line of the addressed row, and may not enable the word line of one of the redundant rows 520 and 522.

Figure 10:
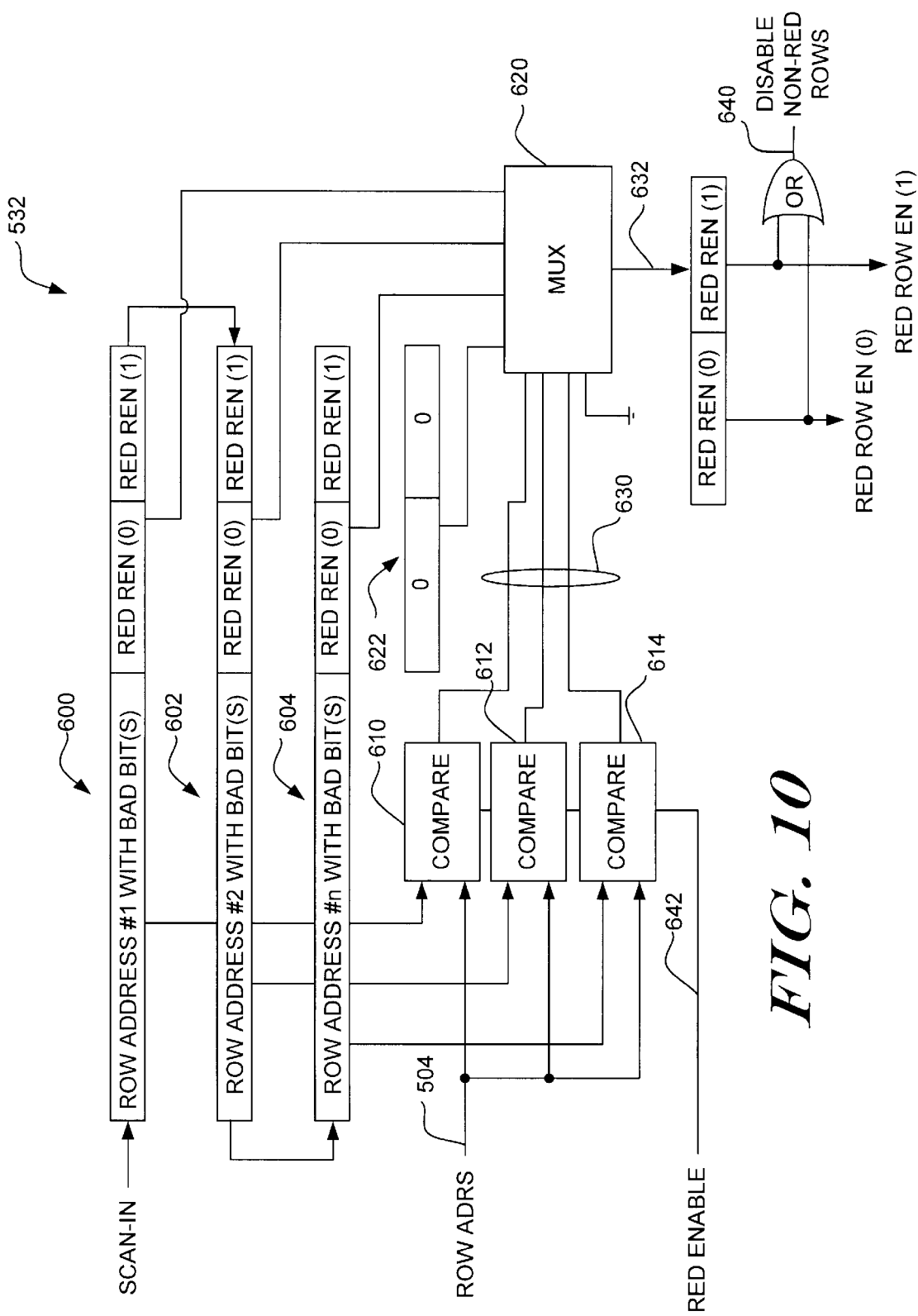
FIG. 10 is a schematic diagram of an illustrative embodiment of the programmable controller of FIG. 9.

In another illustrative embodiment, and as more clearly shown in FIG. 10, the Programmable Controller 532 may include a number of non-volatile registers 600, 602 and 604 for storing the row addresses that have at least one defective memory element. Each non-volatile register 400, 402 and 404 may also store row enable signals for each redundant row of FIG. 9, including redundant rows 520 and 522. These control signals are provided to a multiplexer 620, as shown. A default set of control signals, which causes neither of the redundant rows 520 and 522 to be enabled, is also provided to the multiplexer 620.

The row address 504 is compared to each of the row addresses stored in the non-volatile registers 600, 602 and 604 using comparators 610, 612 and 614, respectively. If the row address does not match any of the row addresses stored in the non-volatile registers 600, 602 and 604, the select lines 630 provided to multiplexer 620 are all zero, allowing default control signals 622 to pass to the mux control output 632. This occurs when the row address corresponds to a row that has no defective memory elements. If, however, the row address 504 matches one of the row addresses stored in the non-volatile registers 600, 602 and 604, the corresponding comparator asserts one of the select lines 630, which causes the control signals stored in the corresponding non-volatile register to pass to the mux control output 632. When either of the control signals at the mux control output 632 is asserted, all of the non-redundant rows are disabled by disable signal 640.

During initial wafer level testing, the redundant enable signal 642 is preferably held low, thereby disabling the comparators 610, 612 and 614. This causes the multiplexer 620 to pass the default control signals 622 to the mux control output 632. Accordingly, none of the rows in the memory array will be replaced with one of the redundant rows 520 or 522. This may allow the memory elements in the array to be effectively tested. Alternatively, it is contemplated that a row address that is out of range may be loaded into the non-volatile registers 600, 602 and 604. Thus, the row address 504 will never match the row addresses in the non-volatile registers 600, 602 and 604, allowing the memory elements in the array to be effectively tested.

Having thus described the preferred embodiments of the present invention, those of skill in the art will readily appreciate that the teachings found herein may be applied to yet other embodiments within the scope of the claims hereto attached.

What is claimed is:

1. A memory comprising:
   one or more memory elements;
   one or more redundant memory elements; and
   programmable replacing circuit for replacing a selected memory element with a selected one of the redundant memory elements, the programmable replacing circuit including a non-volatile memory element for storing a value, and controlled at least in part by the value stored in the non-volatile memory element wherein the non-volatile memory element is configured into a scan chain with other non-volatile memory elements, wherein the value stored in the non-volatile memory element is programmable by scanning the value into the scan chain, and wherein the programmable replacing circuit uses the value stored in the non-volatile memory element to determine which of the memory elements is selected for replacement by the selected one of redundant memory element.

2. A memory according to claim 1, wherein the selected memory element is defective.

3. A memory according to claim 1, wherein the value stored by the non-volatile memory element includes one or more data bits.

4. A memory according to claim 1, wherein the one or more memory elements are arranged into a number of rows and a number of columns, the number of rows being addressed by a provided row address.

5. A memory according to claim 4, wherein the value stored in the non-volatile memory element is a row address that corresponds to a selected row of the memory elements.

6. A memory according to claim 5, wherein the programmable replacing circuit includes:
   a comparator for comparing the row address stored in the non-volatile memory element with the provided row address; and
   providing means for providing one or more signals that cause the selected memory element to be replaced with the selected one of the redundant memory elements when the row address stored in the non-volatile memory element matches the provided row address.

7. A memory according to claim 5, wherein the non-volatile memory element includes a lookup table that has a number of addressable locations, where the addressable locations are addressed by the provided row address, the lookup table providing one or more signals that cause the selected memory element to be replaced with the selected one of the redundant memory elements when the provided row address corresponds to a row that includes the selected memory element.

8. The memory according to claim 1, wherein the programmable replacing circuit is configured to permit programming of the non-volatile memory elements after packaging of the memory.

9. A memory comprising:
   one or more memory elements arranged in a number of columns;
   one or more redundant columns;
   a number of multiplexers, one for each of the number of columns, each of the multiplexers selecting between the corresponding column and the one or more redundant columns; and
   the programmable replacing means coupled to each of the number of multiplexers for causing each multiplexer to select either the corresponding column or one of the redundant columns such that a selected one of the columns is replaced with a selected one of the redundant columns, the programmable replacing means including a number of non-volatile memory elements for storing values, one non-volatile memory element for each multiplexer, the programmable replacing means controlled at least in part by the values stored in the non-volatile memory elements, wherein each of the number of non-volatile memory elements is configured into a scan chain such that the non-volatile memory elements are programmable by scanning values into the scan chain, and wherein the programmable replacing means uses a value stored in a non-volatile memory element to determine which of the redundant columns is selected to replace the corresponding column.

10. A memory according to claim 9, wherein each column has two or more rows of memory elements.

11. A memory according to claim 9, wherein the selected column includes at least one memory element that is defective.

12. The memory according to claim 9, wherein the programmable replacing means is configured to permit values to be scanned into the scan chain after packaging of the memory.

13. A memory comprising:

one or more memory elements arranged in a number of rows;

one or more redundant rows; and programmable replacing means for replacing a selected one of the rows with a selected one of the redundant rows, the programmable replacing means including a non-volatile memory element for storing a value, and controlled at least in part by the value stored in the non-volatile memory element wherein the non-volatile memory element is configured into a scan chain with other non-volatile memory elements, wherein the value stored in the non-volatile memory element is programmable by scanning the value into the scan chain, and wherein the programmable replacing means uses the value stored in the non-volatile memory element to determine which row is selected for replacement by the selected redundant row.

14. A memory according to claim 13, wherein each row has two or more columns of memory elements.

15. A memory according to claim 13, wherein the selected row includes at least one memory element that is defective.

16. A memory according to claim 13, wherein the number of rows are addressed by a provided row address.

17. A memory according to claim 16, wherein the programmable replacing means enables the selected redundant row when the provided address corresponds to the selected row.

18. A memory according to claim 17, wherein the programmable replacing means disables the selected row when the provided address corresponds to the selected row.

19. A memory according to claim 16, wherein the value stored in the non-volatile memory element is a row address that corresponds to the selected row of the memory elements.

20. A memory according to claim 19, wherein the programmable replacing means includes:

a comparator for comparing the row address stored in the non-volatile memory element with the provided row address; and providing means for providing one or more signals that cause the selected row to be replaced with the selected redundant row when the row address stored in the non-volatile memory element matches the provided row address.

21. A memory according to claim 20, wherein the programmable replacing means further includes:

disabling means for disabling the selected row when the row address stored in the non-volatile memory element matches the provided row address.

22. The memory according to claim 13, wherein the scan chain is accessible for programming after packaging of the memory.

23. A method for replacing a selected memory element of a memory with a redundant memory element, the method comprising the steps of:

storing a value in a non-volatile memory, wherein the non-volatile memory element is configured into a scan chain with other non-volatile memory elements, and wherein the value is stored in the non-volatile memory element by scanning the value into the scan chain; and replacing the selected memory element with the redundant memory element if the value stored in the non-volatile memory matches a first predetermined value.

24. A method according to claim 23, wherein the replacing step does not replace the selected memory element with the redundant memory element if the value stored in the non-volatile memory does not match the first predetermined value.

25. A method according to claim 23, wherein the memory includes two or more memory elements, each memory element addressable by a provided address.

26. A method according to claim 25, wherein the value stored in the non-volatile memory is an address that corresponds to the selected memory element.

27. A method according to claim 26, wherein the first predetermined value corresponds to the provided address.

28. A method according to claim 25, wherein the two or more memory elements are arranged into a number of rows and a number of columns, each of the number of rows being addressed by a provided row address.

29. A method according to claim 28, wherein the value stored in the non-volatile memory is a row address that corresponds to a selected row of memory elements.

30. A method according to claim 29, wherein the replacing step includes the steps of:

comparing the row address stored in the non-volatile memory with the provided row address; and providing one or more signals that cause the selected row of memory elements to be replaced with a redundant row of memory elements when the row address stored in the non-volatile memory matches the provided row address.

31. A method according to claim 29, wherein the non-volatile memory includes a lookup table that has a number of addressable locations, where the addressable locations are addressed by the provided row address, the method further comprising the steps of:

loading a value into a location in the lookup table that is addressed by a row address that corresponds to the selected row of memory elements, the value causing the selected row of memory elements to be replaced with the redundant row of memory elements when accessed; and accessing the location in the lookup table when the provided row address matches the row address of the selected row of memory elements.

32. The method according to claim 23, further comprising storing the value in the non-volatile memory in response to a self-test routine after installation of the memory in a system.

\* \* \* \* \*